(12) United States Patent
Lee et al.

(10) Patent No.: US 12,730,379 B2
(45) Date of Patent: Sep. 8, 2026

(54) CONTAINER STOPPER, SUBSTRATE PROCESSING SYSTEM INCLUDING THE SAME, AND SUBSTRATE PROCESSING METHOD USING THE SAME

(71) Applicant: Samsung Electronics Co., Ltd., Suwon-si (KR)

(72) Inventors: Hyunyoung Lee, Suwon-si (KR); Pyungkang Kim, Suwon-si (KR); Donghyun Kim, Suwon si (KR); Jungjoon Park, Suwon-si (KR); Beomsoo Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 401 days.

(21) Appl. No.: 18/390,194

(22) Filed: Dec. 20, 2023

(65) Prior Publication Data

US 2024/0419075 A1 Dec. 19, 2024

(30) Foreign Application Priority Data

Jun. 13, 2023 (KR) ........................ 10-2023-0075271

(51) Int. Cl.

| | |
|---|---|
| ***B67B 7/15*** | (2006.01) |
| ***B65D 41/04*** | (2006.01) |
| ***B65D 47/06*** | (2006.01) |
| ***G03F 7/16*** | (2006.01) |

(52) U.S. Cl.

CPC ........... *G03F 7/16* (2013.01); *B65D 41/0492* (2013.01); *B65D 47/06* (2013.01)

(58) Field of Classification Search

CPC ........ G03F 7/16; B65D 41/0492; B65D 47/06

See application file for complete search history.

(56) References Cited

U.S. PATENT DOCUMENTS

| | | | |
|---|---|---|---|
| 5,035,350 A | 7/1991 | Blette et al. | |
| 5,507,210 A | 4/1996 | Paramest | |
| 9,630,825 B1 | 4/2017 | Lee | |
| 10,196,251 B2 | 2/2019 | Kalogroulis et al. | |
| 2008/0191153 A1 | 8/2008 | Marganski et al. | |
| 2013/0133211 A1 | 5/2013 | Cantore, III et al. | |
| 2016/0368750 A1* | 12/2016 | Kalogroulis | B67B 7/44 |

(Continued)

FOREIGN PATENT DOCUMENTS

| | | |
|---|---|---|
| CN | 106716598 B | 8/2020 |
| CN | 216336505 U | 4/2022 |

(Continued)

*Primary Examiner* — Nathan T Leong

(74) *Attorney, Agent, or Firm* — Muir Patent Law, PLLC

(57) ABSTRACT

A container stopper may include a first gear having a first axis extended in a first direction, a second gear spaced apart from the first axis in a horizontal direction crossing the first direction, a tube coupler coupled to the first gear, and an insertion tube extended from the tube coupler in a downward direction. The tube coupler may include a coupler body coupled to the first gear to be rotatable to the first gear and a first tube fastener, which is placed on and coupled to the coupler body and is connected to the insertion tube. The first gear may have a female thread structure formed on an inner side surface of the first gear, and the second gear may have a rotary coupling structure formed on a top or bottom surface of the second gear.

20 Claims, 15 Drawing Sheets

(56) References Cited

U.S. PATENT DOCUMENTS

| | | | | |
|---|---|---|---|---|
| 2020/0339400 | A1 * | 10/2020 | Hancock .................. | B67B 7/15 |
| 2023/0131562 | A1 | 4/2023 | Lee et al. | |

FOREIGN PATENT DOCUMENTS

| | | | |
|---|---|---|---|
| CN | 115057399 | A | 9/2022 |
| KR | 20-0445651 | Y1 | 8/2009 |
| KR | 10-2499649 | B1 | 2/2023 |
| TW | 408368 | B | 10/2000 |
| TW | 472312 | B | 1/2002 |
| WO | 2012043977 | A2 | 4/2012 |
| WO | 2014032169 | A1 | 3/2014 |

* cited by examiner

FIG. 11

CONTAINER STOPPER, SUBSTRATE PROCESSING SYSTEM INCLUDING THE SAME, AND SUBSTRATE PROCESSING METHOD USING THE SAME

CROSS-REFERENCE TO RELATED APPLICATION

This U.S. non-provisional patent application claims priority under 35 U.S.C. § 119 to Korean Patent Application No. 10-2023-0075271, filed on Jun. 13, 2023, in the Korean Intellectual Property Office, the entire contents of which are hereby incorporated by reference.

BACKGROUND OF THE INVENTION

The present disclosure relates to a container stopper, a substrate processing system including the same, and a method of manufacturing a semiconductor device using the same, and in particular, to a container stopper, which is configured to allow for an automatic replacement of a PR container, a substrate processing system including the same, and a method of manufacturing a semiconductor device using the same.

A process of fabricating a semiconductor device includes various processes. For example, the semiconductor device may be fabricated by a photolithography process, an etching process, a deposition process, and a plating process, which are performed on a substrate. Various fluids may be used for each of the processes. For example, the photolithography process may include a step of coating a substrate with a photoresist (PR) material. The PR material may be contained in a PR container. In the coating step, the PR material in the PR container may be supplied onto the substrate. As the process progresses, it may be important to replace the PR container.

SUMMARY

An embodiment of the inventive concept provides a container stopper, which is configured to allow for an automatic replacement of a PR container, a substrate processing system including the same, and a method of manufacturing a semiconductor device using the same.

An embodiment of the inventive concept provides a container stopper, which is configured to recognize types of PR containers, a substrate processing system including the same, and a method using the same.

An embodiment of the inventive concept provides a container stopper allowing for quick maintenance operations, a substrate processing system including the same, and a method using the same.

According to an embodiment of the inventive concept, a container stopper may include a first gear having a first axis extended in a first direction; a second gear spaced apart from the first axis in a horizontal direction crossing the first direction; a tube coupler coupled to the first gear; and an insertion tube extended from the tube coupler in a downward direction, wherein the tube coupler comprises: a coupler body coupled to the first gear to be rotatable in relation to the first gear; and a first tube fastener, which is placed on and coupled to the coupler body and is connected to the insertion tube, wherein the first gear has a female thread structure formed on an inner side surface of the first gear, and the second gear has a rotary coupling structure formed on a top or bottom surface of the second gear.

According to an embodiment of the inventive concept, a substrate processing system may include a photoresist (PR) supplying device supplying a PR material. The PR supplying device may include a supply tube; and a container stopper connected to the supply tube, wherein the container stopper comprises: a first gear having a first axis extended in a vertical direction; a second gear spaced apart from the first axis in a horizontal direction; and a tube coupler, wherein the tube coupler comprises: a coupler body coupled to the first gear to be rotatable in relation to the first gear; and a first tube fastener placed on and coupled to the coupler body and connected to the supply tube, wherein the first gear has a female thread structure formed on an inner side surface of the first gear.

According to an embodiment of the inventive concept, a method of manufacturing a semiconductor device may include placing a substrate in a substrate processing apparatus; and supplying a fluid to the substrate processing apparatus, in which the substrate is placed, using a photoresist (PR) supplying device, wherein the PR supplying device comprises: a PR container; a supply tube supplying the fluid from the PR container to the substrate processing apparatus; and a container stopper connecting the supply tube to the PR container, wherein the container stopper comprises: a first gear, which is coupled to the PR container in a thread-coupling manner and has a first axis extended in a vertical direction; a second gear spaced apart from the first axis in a horizontal direction; and a tube coupler, wherein the tube coupler comprises: a coupler body coupled to the first gear to be rotatable in relation to the first gear; and a first tube fastener placed on and coupled to the coupler body and connected to the supply tube, wherein the maintaining of the PR container comprises: rotating the second gear, causing the first gear to rotate and separate the container stopper from the PR container; and replacing the PR container.

BRIEF DESCRIPTION OF THE DRAWINGS

FIGS. 11 to 15 are diagrams illustrating a method of manufacturing a semiconductor device according to the flow chart of FIG. 10.

DETAILED DESCRIPTION

Figure 1:
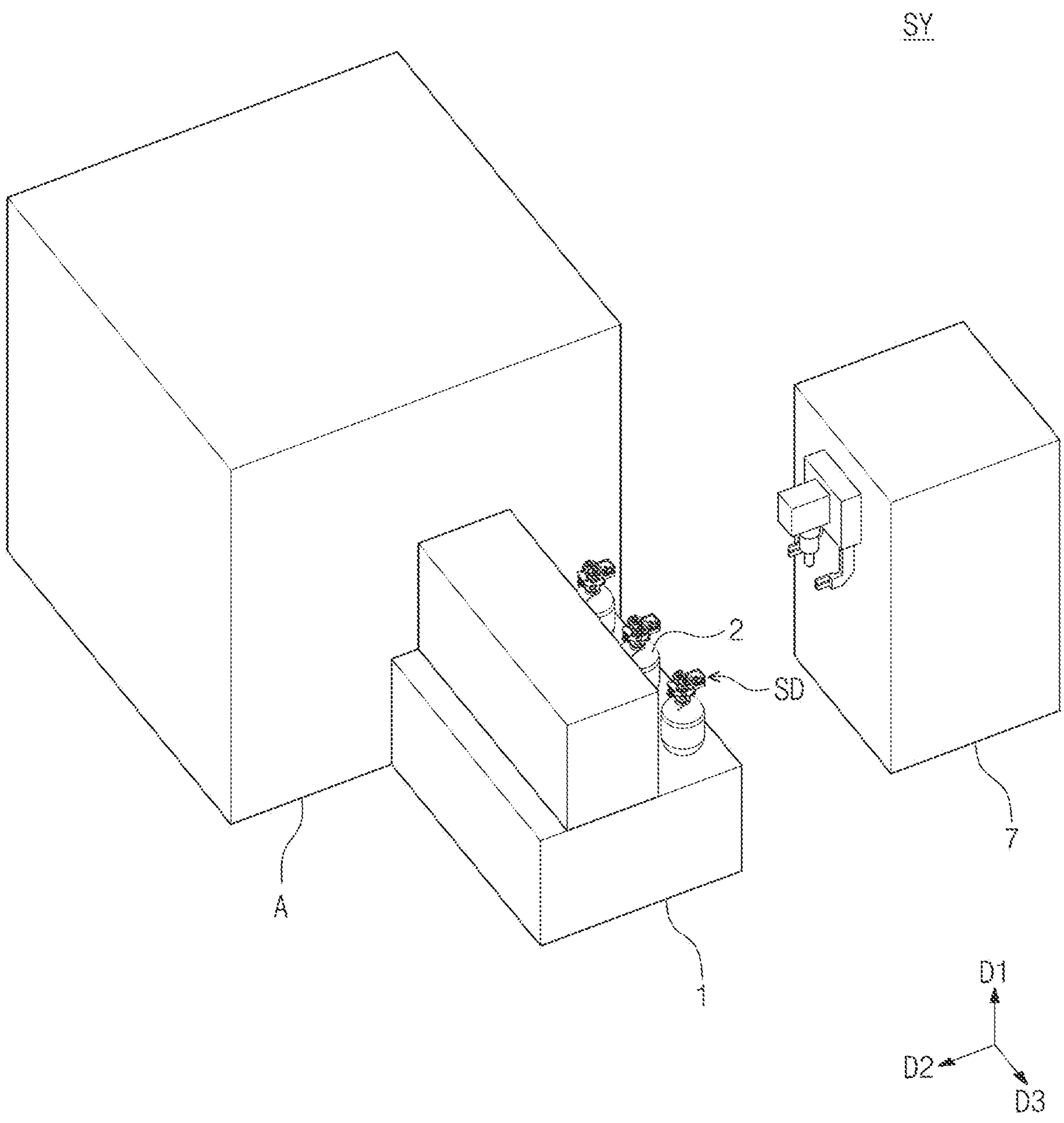
FIG. 1 is a perspective view illustrating a substrate processing system according to an embodiment of the inventive concept.

Example embodiments of the inventive concepts will now be described more fully with reference to the accompanying drawings, in which example embodiments are shown. Like reference numerals in the drawings denote like elements, and thus their description will be omitted.

FIG. 1 is a perspective view illustrating a substrate processing system according to an embodiment of the inventive concept.

In the present application, the reference numbers D1, D2, and D3 will be used to denote a first direction, a second direction, and a third direction, respectively, which are not parallel to each other. The first direction D1 may be referred to as a vertical or upward direction. In addition, each of the second and third directions D2 and D3 may be referred to as a horizontal direction.

Referring to FIG. 1, a substrate processing system SY may be provided. The substrate processing system SY may be one of various systems that are configured to perform a specific process on a substrate. In the present specification, the term 'substrate' may mean a silicon wafer, but the inventive concept is not limited thereto. The substrate processing system SY may be a system that is configured to spray a fluid onto the substrate. For example, the substrate processing system SY may be configured to spray a photoresist (PR) material onto the substrate. For this, the substrate processing system SY may include a substrate processing apparatus A, a PR supplying device SD, a PR container 2, a supplying table 1, and a replacing robot 7.

The substrate processing apparatus A may be a chamber, in which a process on the substrate is performed. For example, the substrate processing apparatus A may be used to coat the substrate with the PR material. However, the inventive concept is not limited to this example, and in an embodiment, the substrate processing apparatus A may be a different type of apparatus that is configured to process the substrate using a fluid. The substrate processing apparatus A will be described in more detail below.

The PR supplying device SD may be configured to supply a fluid to the substrate processing apparatus A. For example, the PR supplying device SD may be disposed to supply a photoresist (PR) material to the substrate processing apparatus A. The PR supplying device SD may connect the PR container 2 to the substrate processing apparatus A. A fluid in the PR container 2 may be supplied to the substrate processing apparatus A through the PR supplying device SD. In an embodiment, a plurality of the PR supplying devices SD may be provided. The PR supplying devices SD may be spaced apart from each other in a horizontal direction. However, in order to reduce complexity in the description, one of the PR supplying devices SD will be described as an example. The PR supplying device SD will be described in more detail below.

The PR container 2 may be configured to store the fluid and/or supply the fluid to another apparatus. For example, the PR container 2 may be used to store the PR material and supply the PR material to the substrate processing apparatus A. In an embodiment, a plurality of the PR containers 2 may be provided. The PR containers 2 may be spaced apart from each other in a horizontal direction. However, in order to reduce complexity in the description, one of the PR containers 2 will be described as an example. The PR container 2 will be described in more detail below.

The supplying table 1 may support the PR container 2. The supplying table 1 may be coupled to the substrate processing apparatus A. The supplying table 1 may be configured to be inserted into a substrate processing chamber 61 (e.g., see FIG. 9). When there is a need to replace the PR container 2, the supplying table 1 may be unloaded from the substrate processing chamber 61.

The replacing robot 7 may be used to replace the PR container 2. The replacing robot 7 may be movable. The replacing robot 7 will be described in more detail below.

Figure 2:
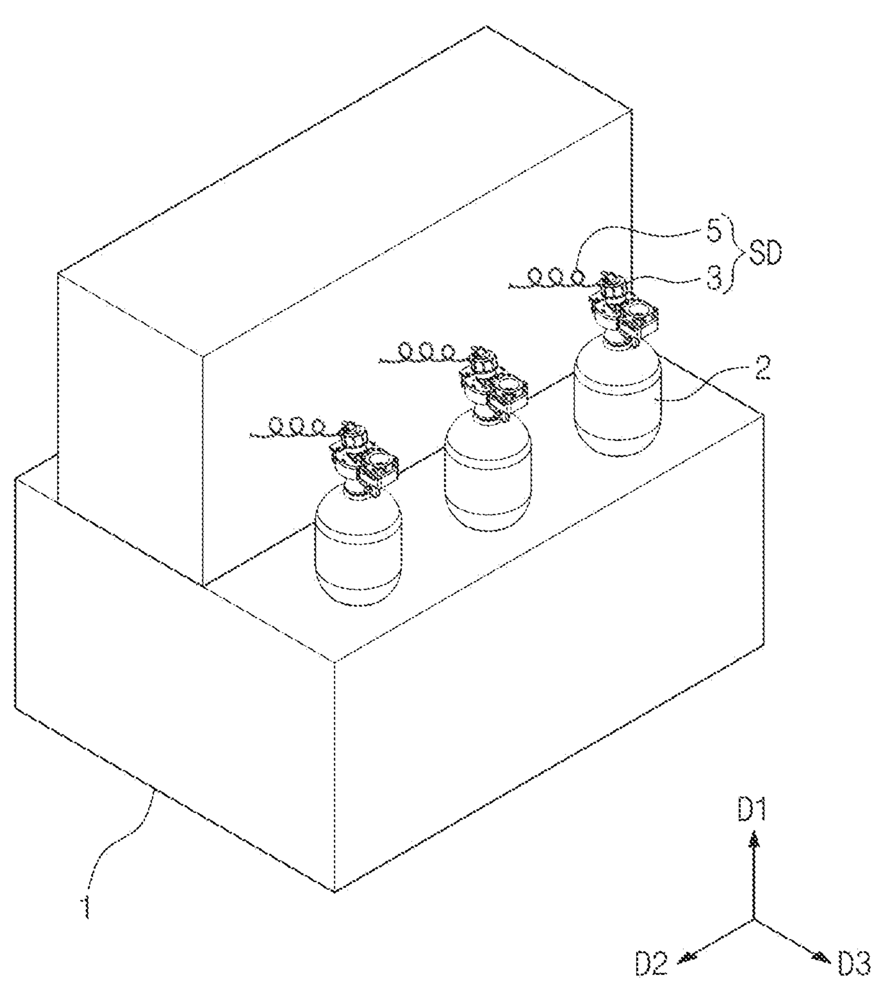
FIG. 2 is a perspective view illustrating a PR supplying device, which is disposed on a supplying table, according to an embodiment of the inventive concept.
Figure 3:
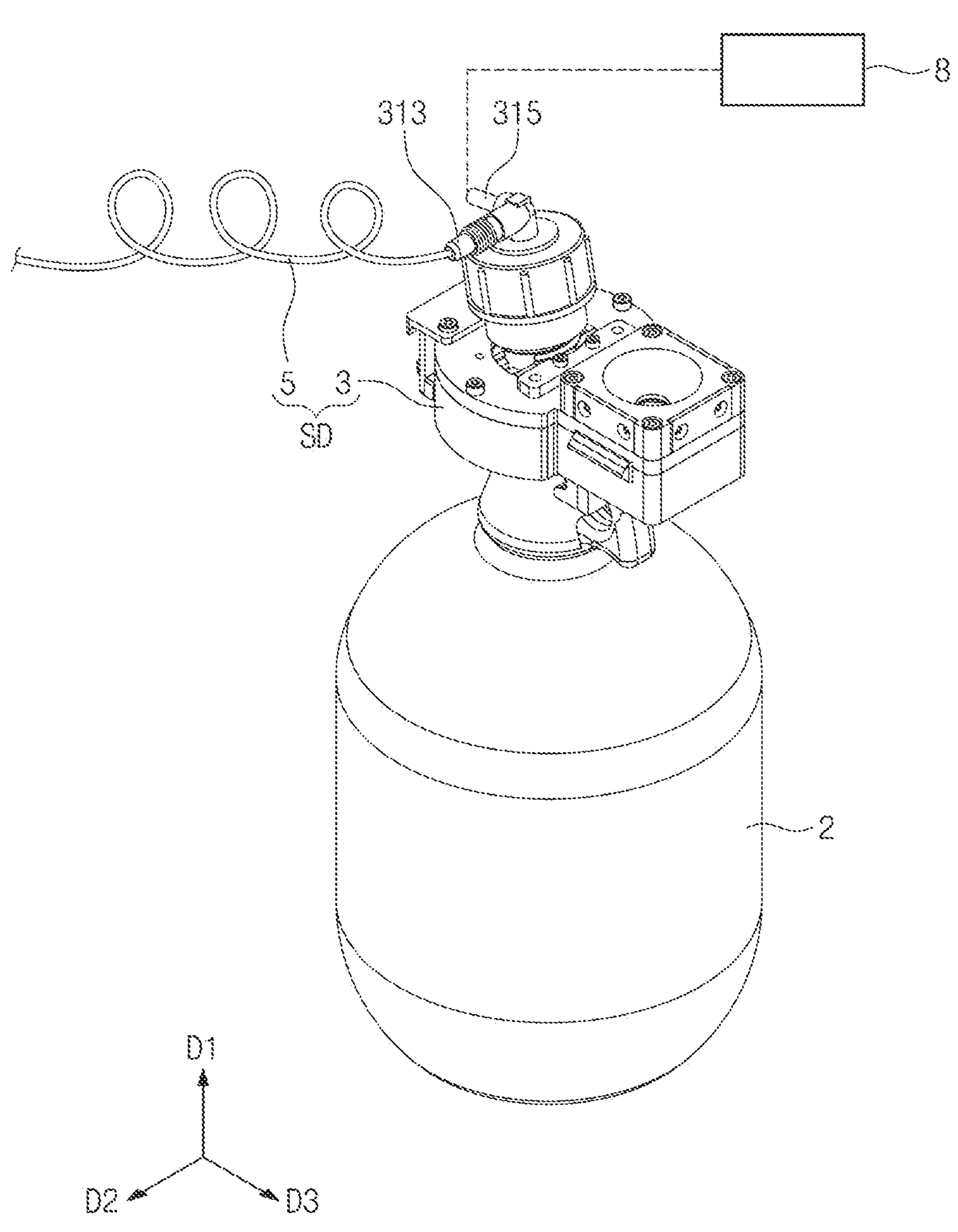
FIG. 3 is a perspective view illustrating a PR supplying device according to an embodiment of the inventive concept.

FIG. 2 is a perspective view illustrating a PR supplying device, which is disposed on a supplying table, according to an embodiment of the inventive concept, and FIG. 3 is a perspective view illustrating a PR supplying device according to an embodiment of the inventive concept.

Referring to FIGS. 2 and 3, the PR supplying device SD may include a container stopper 3 and a supply tube 5.

The container stopper 3 may be placed on and coupled to the PR container 2. The container stopper 3 may be configured to seal the PR container 2. The container stopper 3 may be coupled to the PR container 2 in a thread-coupling manner. The PR container 2 may be connected to the outside through the container stopper 3. For example, the PR container 2 may be connected to the substrate processing apparatus A (e.g., see FIG. 1) through the supply tube 5 coupled with a first tube fastener 313. Accordingly, a fluid in the PR container 2 may be supplied to the substrate processing apparatus A. In addition, the PR container 2 may be connected to a gas supplying part 8 through a second tube fastener 315. In this case, a gas in the gas supplying part 8 may be supplied to the PR container 2. The container stopper 3 will be described in more detail below.

The supply tube 5 may be connected to the container stopper 3. For example, an end of the supply tube 5 may be coupled to the first tube fastener 313. The first tube fastener 313 may be, for example, a tube having an opening such that the tube may be communicatively connected to the supply tube 5 through the opening. An opposite end of the supply tube 5 may be connected to the substrate processing apparatus A (e.g., see FIG. 1). The supply tube 5 may connect the container stopper 3 to the substrate processing apparatus A. The fluid in the PR container 2 may sequentially pass through the container stopper 3 and the supply tube 5 and may be supplied to the substrate processing apparatus A.

Figure 4:
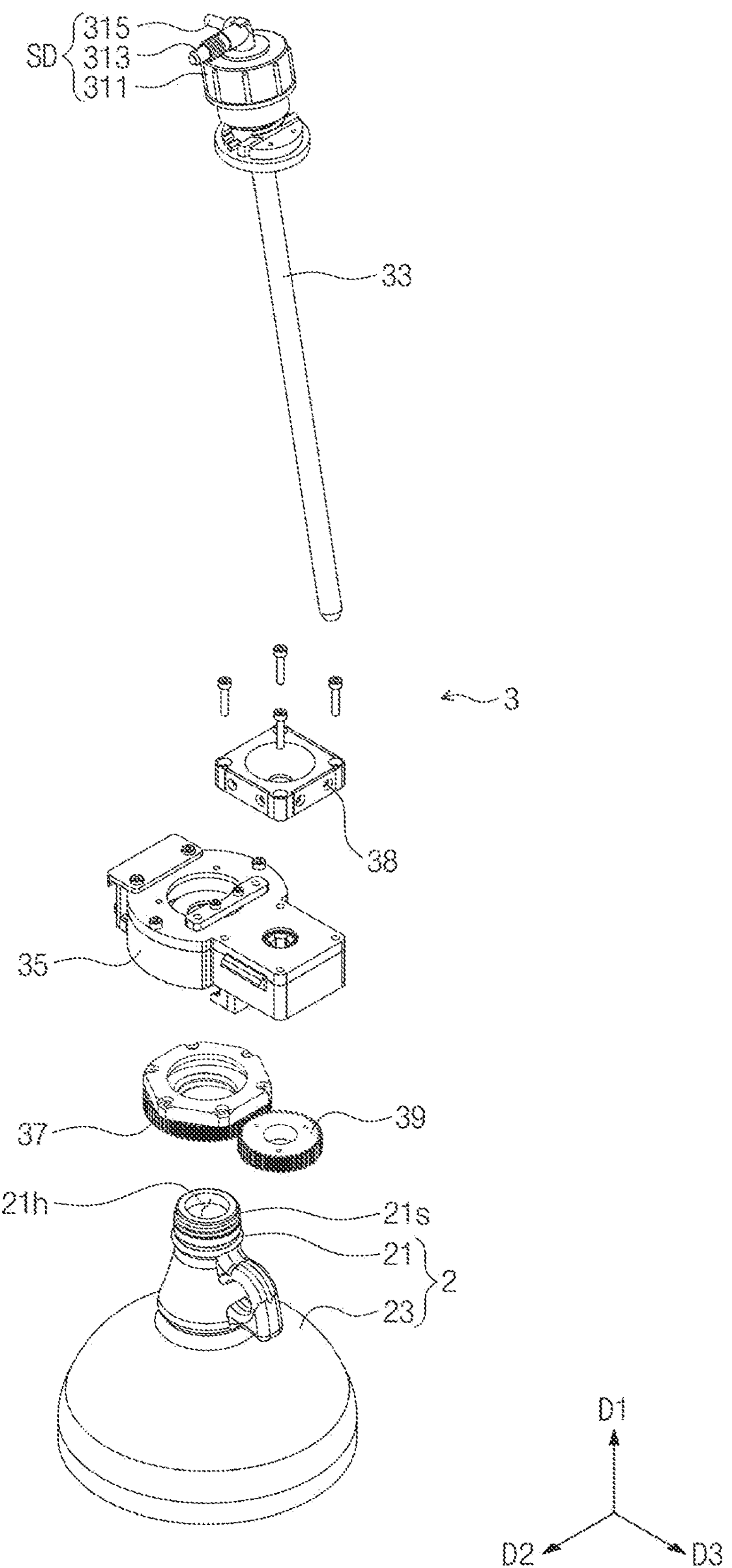
FIG. 4 is an exploded perspective view illustrating a PR supplying device according to an embodiment of the inventive concept.
Figure 5:
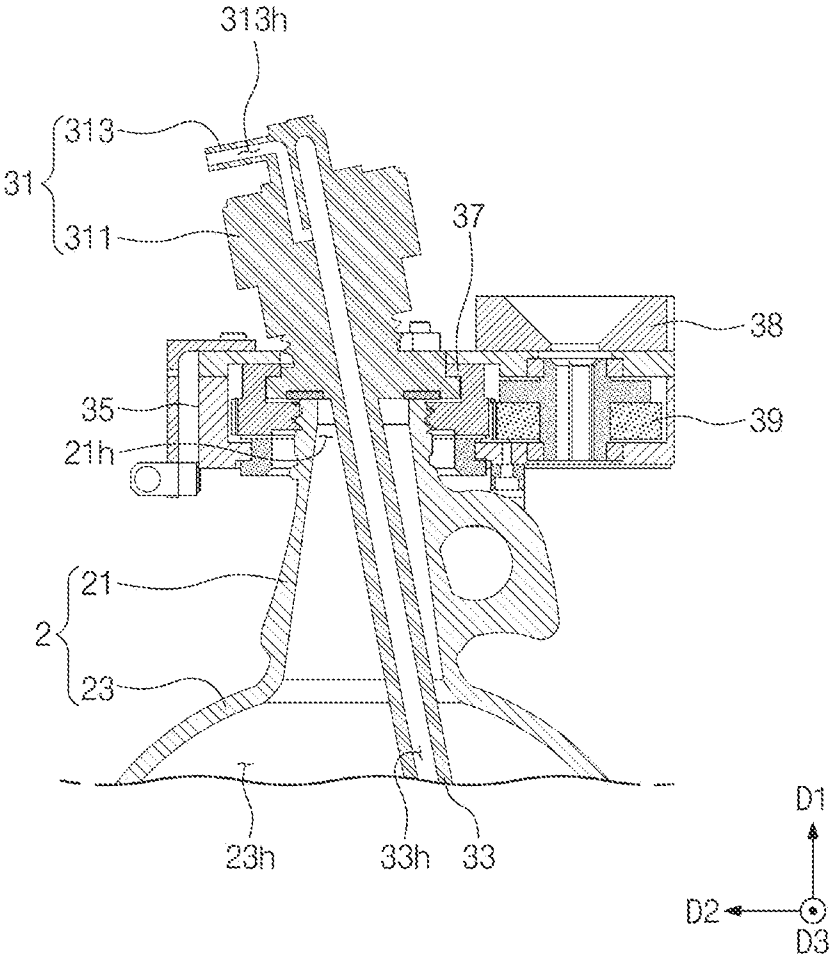
FIG. 5 is a sectional view illustrating a PR supplying device according to an embodiment of the inventive concept.
Figure 6:
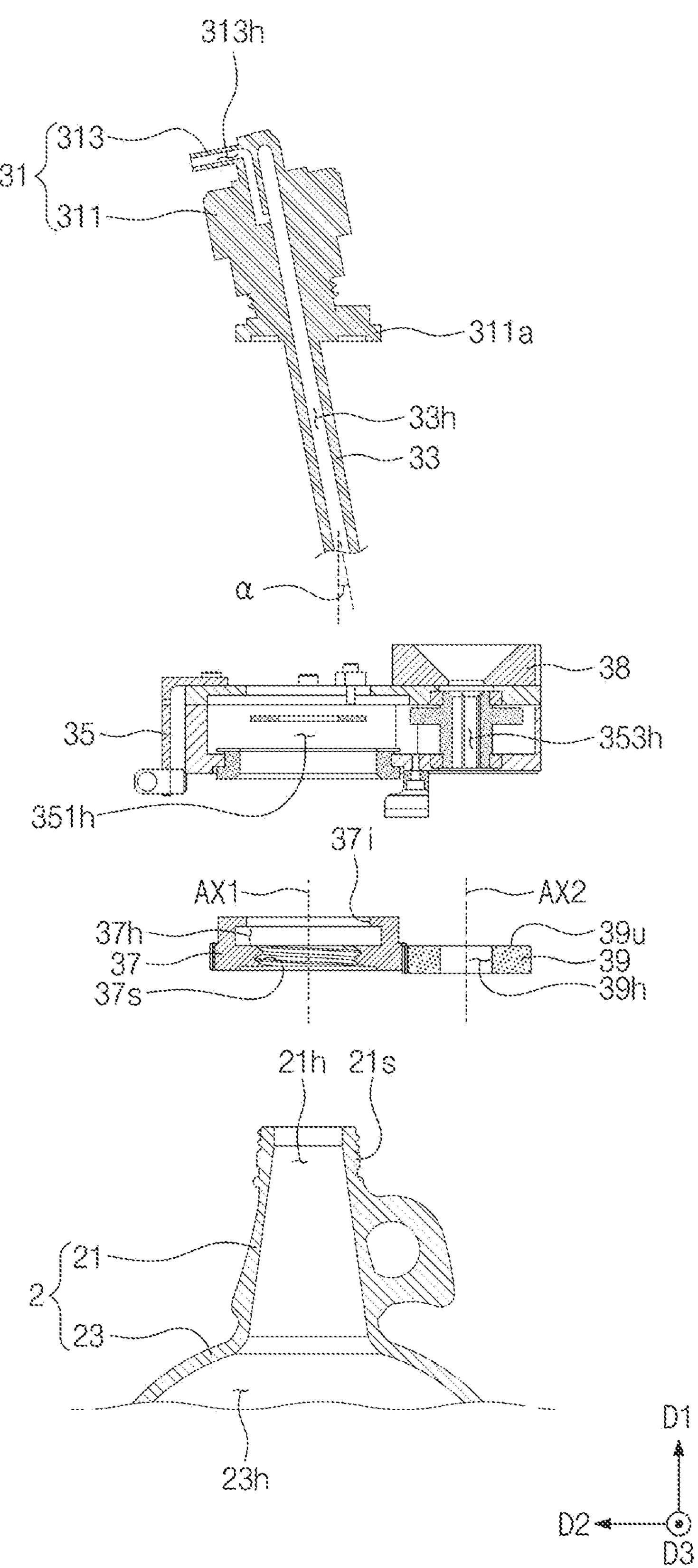
FIG. 6 is an exploded sectional view illustrating an PR supplying device according to an embodiment of the inventive concept.
Figure 7:
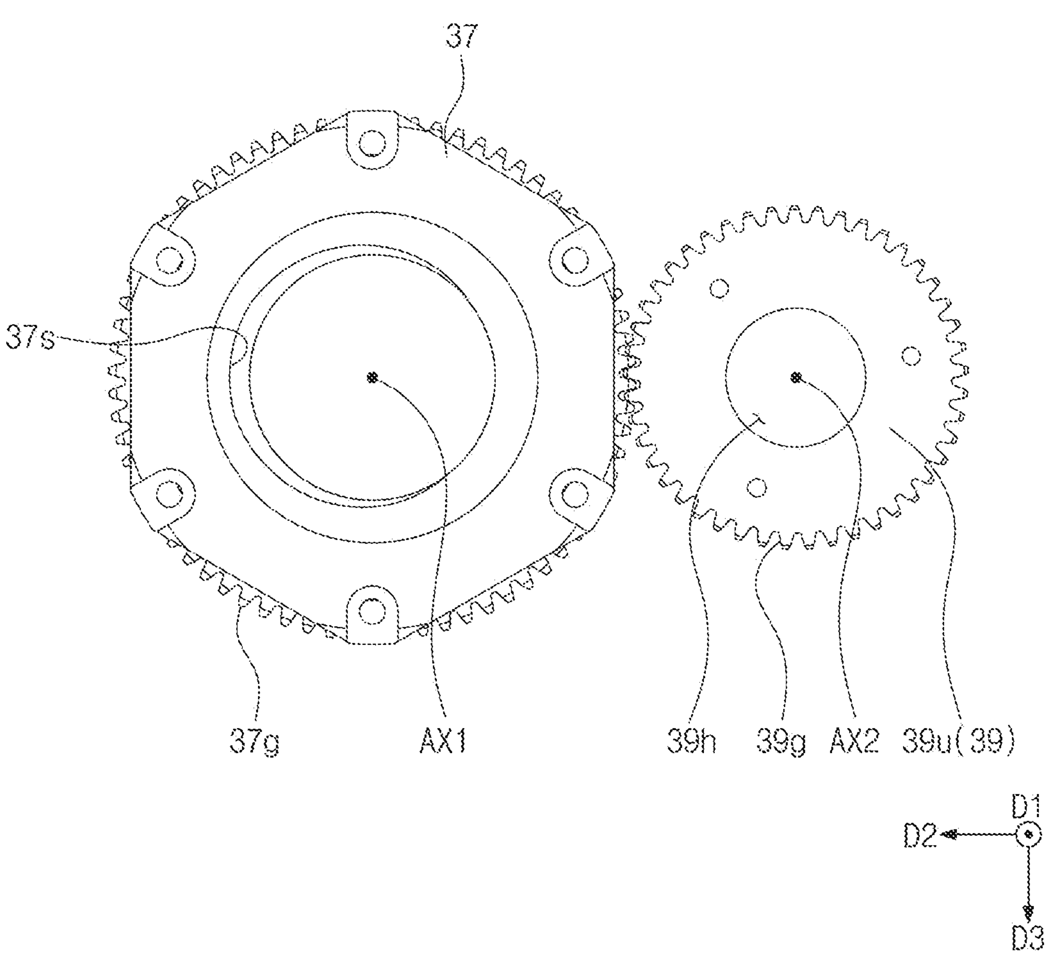
FIG. 7 is a plan view illustrating a container stopper according to an embodiment of the inventive concept.

FIG. 4 is an exploded perspective view illustrating a PR supplying device according to an embodiment of the inventive concept, FIG. 5 is a sectional view illustrating a PR supplying device according to an embodiment of the inventive concept, FIG. 6 is an exploded sectional view illustrating a PR supplying device according to an embodiment of the inventive concept, and FIG. 7 is a plan view illustrating a container stopper according to an embodiment of the inventive concept.

Referring to FIGS. 4 to 7, the PR container 2 may include a container body 23 and a coupling portion 21.

The container body 23 may be provided to have an internal space 23*h*. A fluid may be contained in the internal space 23*h*. For example, a photoresist (PR) may be contained in the internal space 23*h*.

The coupling portion 21 may be positioned on the container body 23. The coupling portion 21 may have a container entrance 21*h*. The container entrance 21*h* may be connected to the internal space 23*h*. The coupling portion 21 may be provided to have a male thread structure 21*s* (e.g., on an outer surface thereof). Due to the male thread structure

21*s*, the container stopper 3 may be coupled to the PR container 2 in a thread-coupling manner. This will be described in more detail below.

The container stopper 3 may include a first gear 37, a second gear 39, a tube coupler 31, an insertion tube 33, a housing 35, and a marking member 38.

The first gear 37 may have a first axis AX1, which is extended in the first direction D1. First teeth 37*g* (e.g., teeth of the first gear 37) may be provided on an outer side surface of the first gear 37. Due to the first teeth 37*g*, the rotation of the second gear 39 may lead to the rotation of the first gear 37. A female thread structure 37*s* may be provided on at least a portion of an inner side surface 37*i* of the first gear 37. The female thread structure 37*s* may be coupled to the male thread structure 21*s* of the PR container 2 in a thread-coupling manner. The first gear 37 may have a rotation space 37*h*, which is recessed from a portion of the inner side surface 37*i* of the first gear 37 in an outward direction. For example, an inner radius of the first gear 37 at the rotation space 37*h* may be larger than an inner radius of another portion of the first gear 37 (e.g., the portion of the first gear 37 at the female thread structure 37*s*). At least a portion of the tube coupler 31 may be inserted in the rotation space 37*h*. In a state in which at least a part of the tube coupler 31 is inserted into the rotation space 37*h*, the tube coupler 31 may be rotatable in relation to the first gear 37. This will be described in more detail below.

The second gear 39 may be spaced apart from the first axis AX1 in a horizontal direction. For example, the second gear 39 may be provided to have a second axis AX2 that is spaced apart from the first axis AX1 in the second direction D2. In an embodiment, the second axis AX2 may be extended in the first direction D1. Second teeth 39*g* (e.g., teeth of the second gear 39) may be provided on an outer side surface of the second gear 39. The second teeth 39*g* may fittingly engage with the first teeth 37*g*. More specifically, the second teeth 39*g* may directly engage with the first teeth 37*g*. However, the inventive concept is not limited to this example, and in an embodiment, the second teeth 39*g* may be connected to the first teeth 37*g* using another element. For example, the second teeth 39*g* may be connected to the first teeth 37*g* using a chain and/or a belt. The second gear 39 may be provided to have a rotary coupling structure 39*h*. In an embodiment, the rotary coupling structure 39*h* may be formed on a top surface 39*u* of the second gear 39. The rotary coupling structure 39*h* may be provided to have a shape corresponding to a rotating member 751 of a rotating unit 75 (e.g., see FIG. 8). For example, the rotary coupling structure 39*h* may be a hole that is recessed downward from the top surface 39*u* of the second gear 39. In this case, the rotary coupling structure 39*h* may be provided to vertically penetrate the second gear 39, but the inventive concept is not limited to this example. The rotary coupling structure 39*h* may have a hexagonal shape, when viewed in a plan view. However, the inventive concept is not limited to this example, and in an embodiment, the rotary coupling structure 39*h* may have a circular shape, when viewed in a plan view, as shown in FIG. 7. Alternatively, the rotary coupling structure 39*h* may have one of various polygonal shapes, when viewed in a plan view. The rotary coupling structure 39*h* may have a shape protruding from the top surface 39*u* of the second gear 39. For example, the rotary coupling structure 39*h* may include a structure that is extended upward from the top surface 39*u* of the second gear 39. In this case, the rotating member 751 (e.g., see FIG. 8) may be or include a hole, in which the rotary coupling structure 39*h* is inserted. So far, the rotary coupling structure 39*h* has been described as being connected to the top surface 39*u* of the second gear 39, but the inventive concept is not limited to this example. For example, the rotary coupling structure 39*h* may be formed on a bottom surface of the second gear 39. As an example, the rotary coupling structure 39*h* may be a hole that is recessed upward from the bottom surface of the second gear 39 by a specific depth. Alternatively, the rotary coupling structure 39*h* may have a shape protruding from the bottom surface of the second gear 39 in a downward direction by a specific length. However, for convenience in description and illustration, the rotary coupling structure 39*h* will be described and illustrated to have a shape that is recessed downward from the top surface 39*u* of the second gear 39.

The tube coupler 31 may be coupled to the first gear 37. The tube coupler 31 may be configured to be rotatable in relation to the first gear 37. In other words, the first gear 37 may be rotatable in relation to the tube coupler 31. The tube coupler 31 may include a coupler body 311, the first tube fastener 313, and the second tube fastener 315. The tube coupler 31 may be, for example, a lid sealing the container entrance 21*h* of the coupling portion 21 of the PR container 2. The coupler body 311 may be the body of the lid and the first and second tube fasteners 313 and 315 may be, for example, openings in the lid to which the supply tube 5 and the gas supplying part 8 are connected. The insertion tube 33 may be communicatively connected to the openings and may pass through the lid to the internal space of the PR container 2.

The coupler body 311 may be coupled to the first gear 37 and/or the housing 35. The coupler body 311 may include an insertion member 311*a*. The insertion member 311*a* may be inserted into the rotation space 37*h* of the first gear 37. In a state in which the insertion member 311*a* is inserted in the rotation space 37*h*, the first gear 37 may be rotatable about an axis that is parallel to the first direction D1 tube coupler.

The first tube fastener 313 may be positioned on and coupled to the coupler body 311. The first tube fastener 313 may be connected to the supply tube 5 (e.g., see FIG. 3). That is, the supply tube 5 may be coupled to the first tube fastener 313. The first tube fastener 313 may be extended in a horizontal direction. For example, the first tube fastener 313 may be extended in the second direction D2. As another example, the first tube fastener 313 may be extended in a direction forming an acute angle with the second direction D2. The first tube fastener 313 may be connected to the insertion tube 33. More specifically, a supplying space 313*h* of the first tube fastener 313 may be connected to a suction space 33*h* of the insertion tube 33.

The second tube fastener 315 may be placed on and coupled to the coupler body 311. The second tube fastener 315 may be connected to the gas supplying part 8 (e.g., see FIG. 3). The second tube fastener 315 may be, for example, a tube having an opening such that the tube may be communicatively connected to the gas supplying part 8 through the opening. In this case, the gas in the gas supplying part 8 may be supplied to the PR container 2 through the second tube fastener 315. Accordingly, the second tube fastener 315 may be connected to the insertion tube 33. The second tube fastener 315 may be extended in a horizontal direction. As another example, the second tube fastener 315 may be extended in a direction forming an acute angle with the second direction D2. The second tube fastener 315 may be extended in a direction that is different from an extension direction of the first tube fastener 313. For example, the second tube fastener 315 may be extended in the third direction D3.

The insertion tube 33 may be extended from the tube coupler 31 in a downward direction. The insertion tube 33 may be provided to have the suction space 33*h*. The insertion tube 33 may be inserted in the PR container 2. More specifically, at least a portion of the insertion tube 33 may be inserted in the internal space 23*h* of the container body 23. The insertion tube 33 may be connected to each of the first and second tube fasteners 313 and 315. An axis of the insertion tube 33 may be inclined at a first angle $\alpha$ to the first direction D1. The first angle $\alpha$ may be an acute angle. For example, the first angle $\alpha$ may be about 1° to about 30°. However, the inventive concept is not limited to this example, and in an embodiment, the axis of the insertion tube 33 may be parallel to the first direction D1.

The housing 35 may be provided to enclose the first gear 37 and the second gear 39. Each of the first and second gears 37 and 39 may be configured to rotate in relation to the housing 35. The housing 35 may be coupled to the tube coupler 31. More specifically, the housing 35 may be fixedly coupled to the tube coupler 31. The housing 35 may be provided to have a main hole 351*h* and an extension hole 353*h*. The main hole 351*h* may be formed to vertically penetrate the housing 35. The tube coupler 31 and/or the first gear 37 may be placed in the main hole 351*h*. The extension hole 353*h* may be provided to expose the rotary coupling structure 39*h*.

The marking member 38 may be placed on the second gear 39. In an embodiment, the marking member 38 may be placed on and coupled to the housing 35. Due to the marking member 38, the positions of the PR container 2 and/or the container stopper 3 may be recognized by the replacing robot 7 (e.g., see FIG. 8). Thus, the replacing robot 7 may precisely grasp the container stopper 3. In an embodiment, the marking member 38 may be provided to display code information on the type of the PR container 2. For example, the marking member 38 may include a QR code (not shown). However, the inventive concept is not limited to this example, and in an embodiment, the marking member 38 may include a barcode or the like. For example, the marking member 38 may be configured to accommodate a rotating member 751 of a rotating unit 75 of a replacing robot 7, described below, to cause the second gear 39 to rotate.

Figure 8:
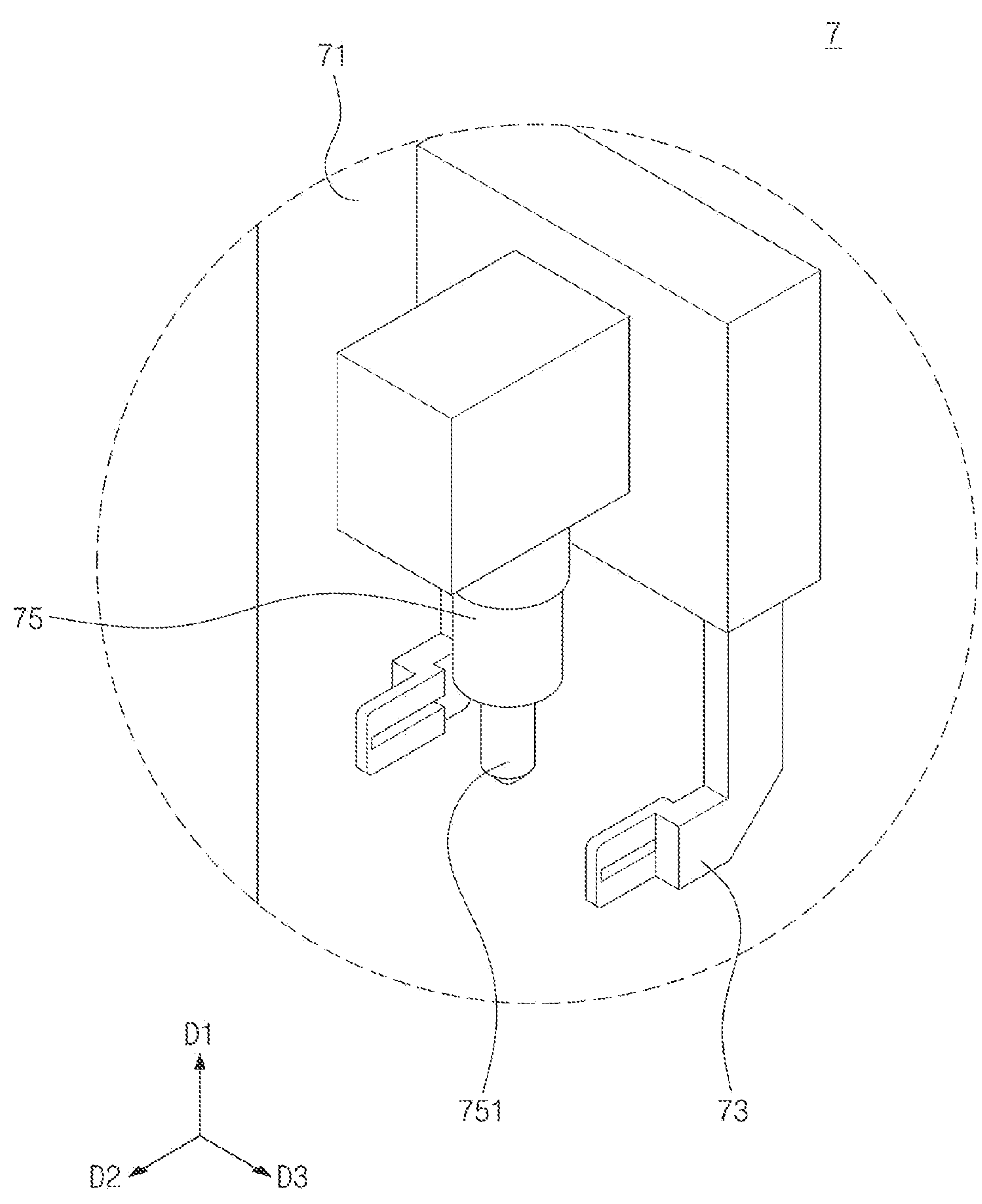
FIG. 8 is a perspective view illustrating a robot according to an embodiment of the inventive concept.

FIG. 8 is a perspective view illustrating a replacing robot according to an embodiment of the inventive concept.

Referring to FIG. 8, the replacing robot 7 may include a robot body 71, a gripper 73, and a rotating unit 75.

The robot body 71 may support the gripper 73 and the rotating unit 75. The robot body 71 may be a movable element. Accordingly, the robot body 71 may include a wheel and an actuator.

The gripper 73 may be coupled to the robot body 71. The gripper 73 may be configured to grip the housing 35 (e.g., see FIG. 4) to fix the housing 35 in place. In an embodiment, the replacing robot 7 may include a pair of the grippers 73. However, for convenience in description, one of the grippers 73 will be described as an example.

The rotating unit 75 may be coupled to the robot body 71. The rotating unit 75 may include the rotating member 751. The rotating member 751 may be selectively inserted in the rotary coupling structure 39*h* (e.g., see FIG. 7). In the case where the rotating member 751 rotates when the rotating member 751 is inserted in the rotary coupling structure 39*h*, the second gear 39 (e.g., see FIG. 7) may also rotate.

The rotating unit 75 and the gripper 73 have been described as independent or separate units, but the inventive concept is not limited to this example. For example, the rotating unit 75 and the gripper 73 may be provided as a single object.

Figure 9:
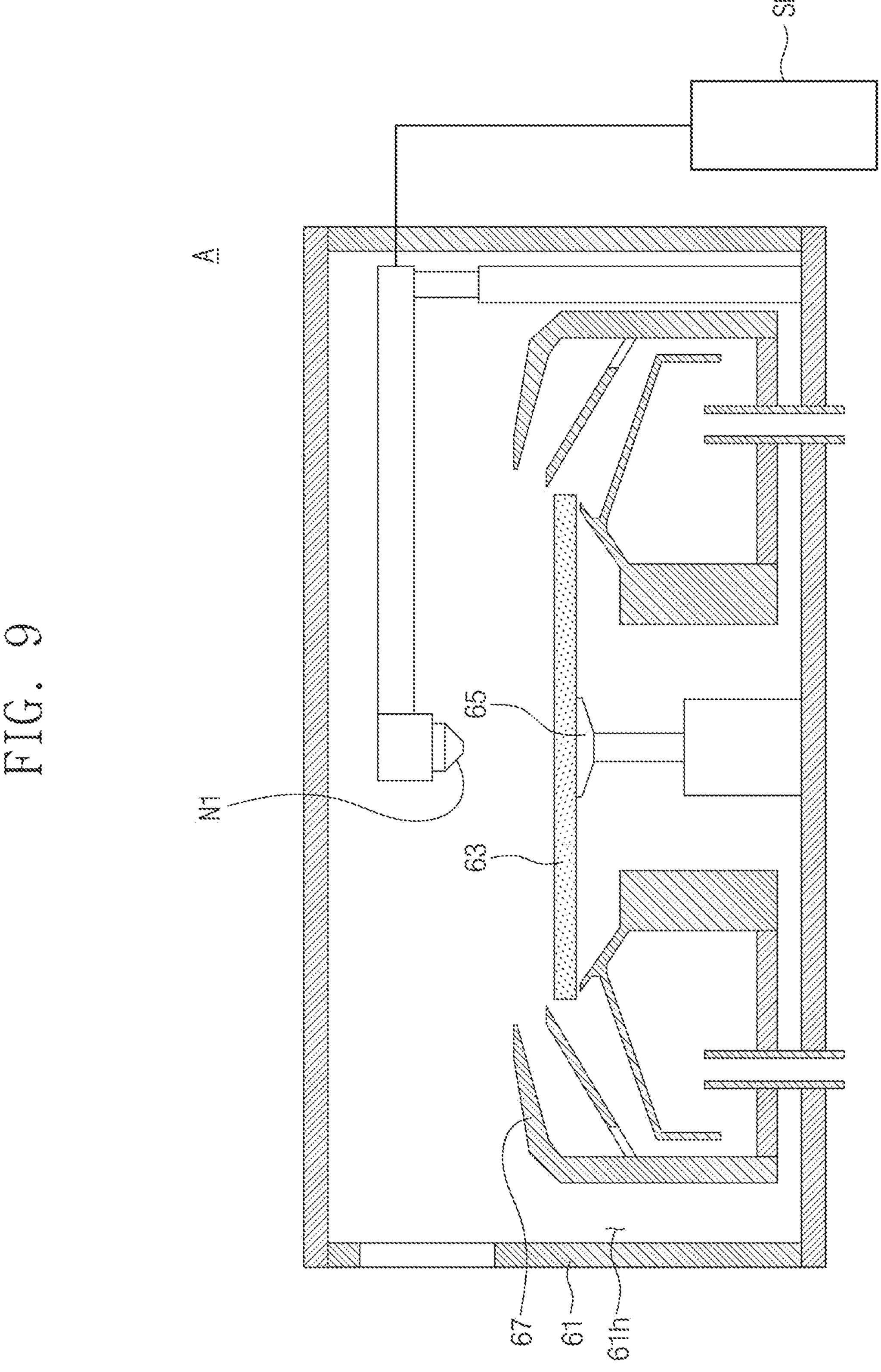
FIG. 9 is a sectional view illustrating a substrate processing apparatus according to an embodiment of the inventive concept.

FIG. 9 is a sectional view illustrating a substrate processing apparatus according to an embodiment of the inventive concept.

Referring to FIG. 9, the substrate processing apparatus A may include a PR coating device. For example, the substrate processing apparatus A may include a substrate processing chamber 61, a chuck 63, a rotation driving device 65, a PR nozzle N1, and a bowl 67.

The substrate processing chamber 61 may be provided to have a process space 61*h*. In the substrate processing chamber 61, a coating process may be performed on the substrate.

The chuck 63 may be placed in the substrate processing chamber 61. The chuck 63 may support a substrate.

The rotation driving device 65 may be configured to rotate the chuck 63.

Accordingly, the substrate on the chuck 63 may be rotated.

The PR nozzle N1 may be spaced apart from the chuck 63 in an upward direction. The PR nozzle N1 may be connected to the PR supplying device SD. A fluid in the PR supplying device SD may be supplied to the PR nozzle N1 and may be sprayed onto the substrate. In this case, the substrate on the chuck 63 may be coated with the fluid, which is sprayed through the PR nozzle N1. Here, the substrate may be rotated by the chuck 63. In this case, the fluid, which is in contact with a top surface of the substrate, may be pushed in an outward direction, owing to the rotation of the substrate.

The bowl 67 may be provided to enclose the chuck 63. The bowl 67 may be used to collect the fluid which escapes from the top surface of the substrate.

Figure 10:
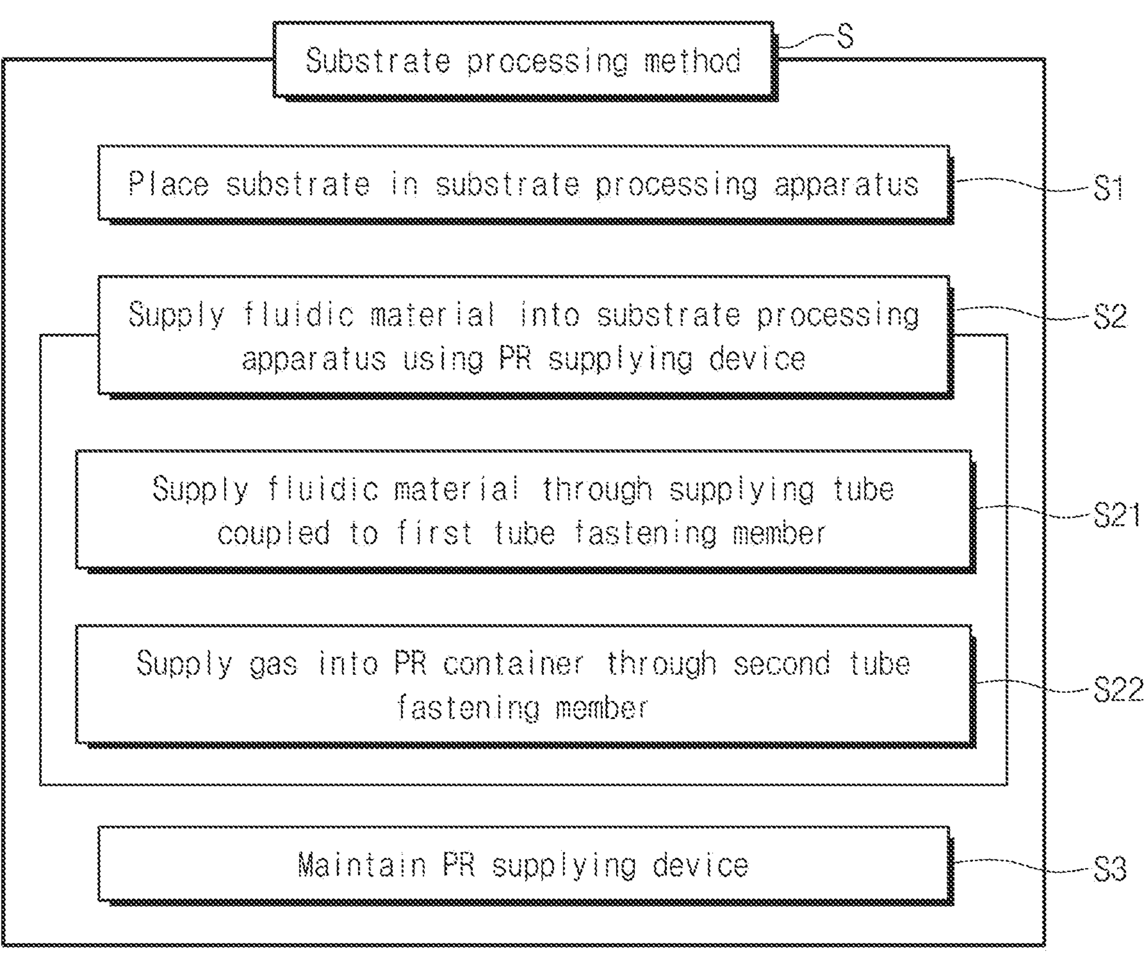
FIG. 10 is a flow chart illustrating a method of manufacturing a semiconductor device according to an embodiment of the inventive concept.
Figure 12:
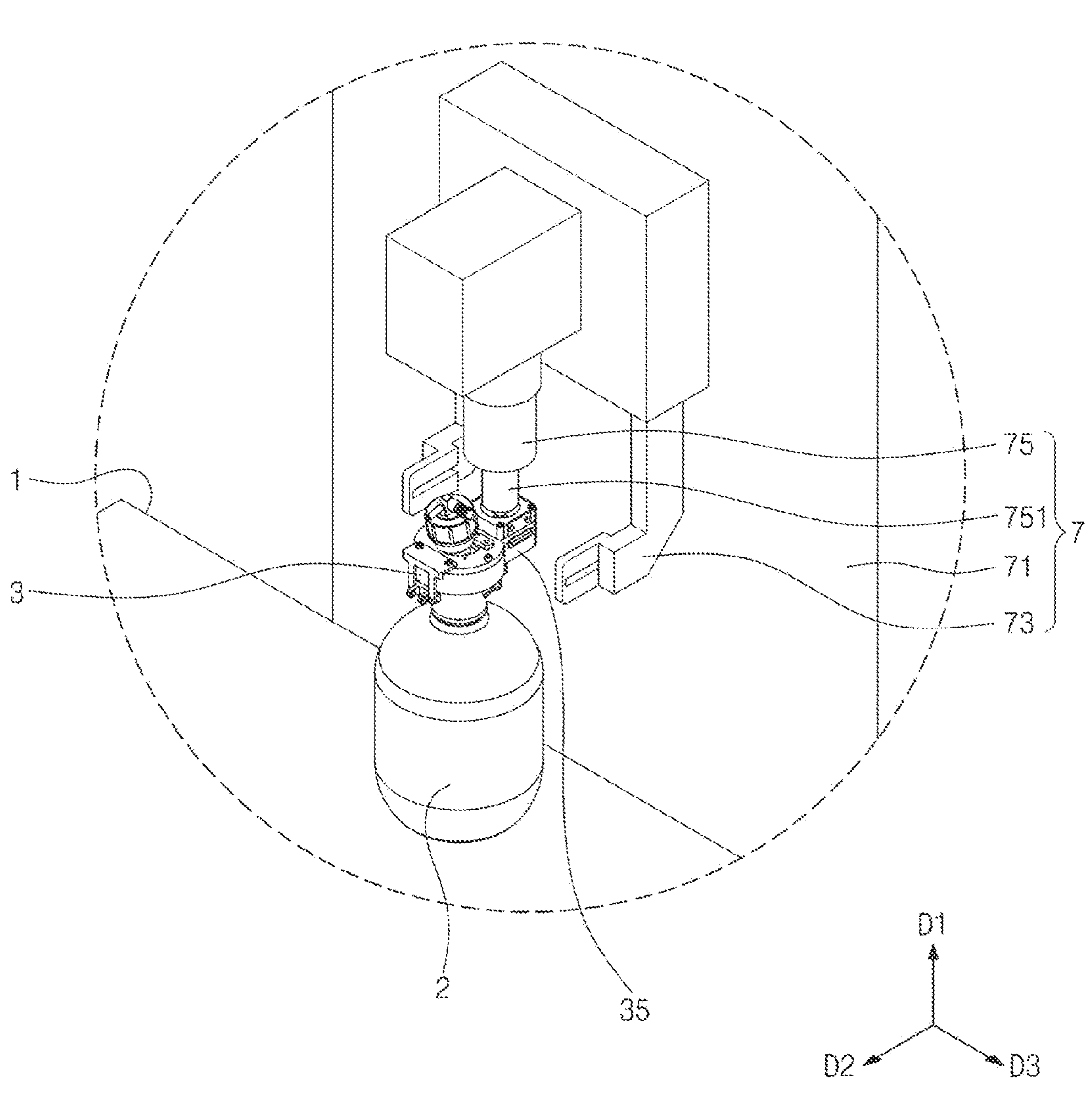
Figure 13:
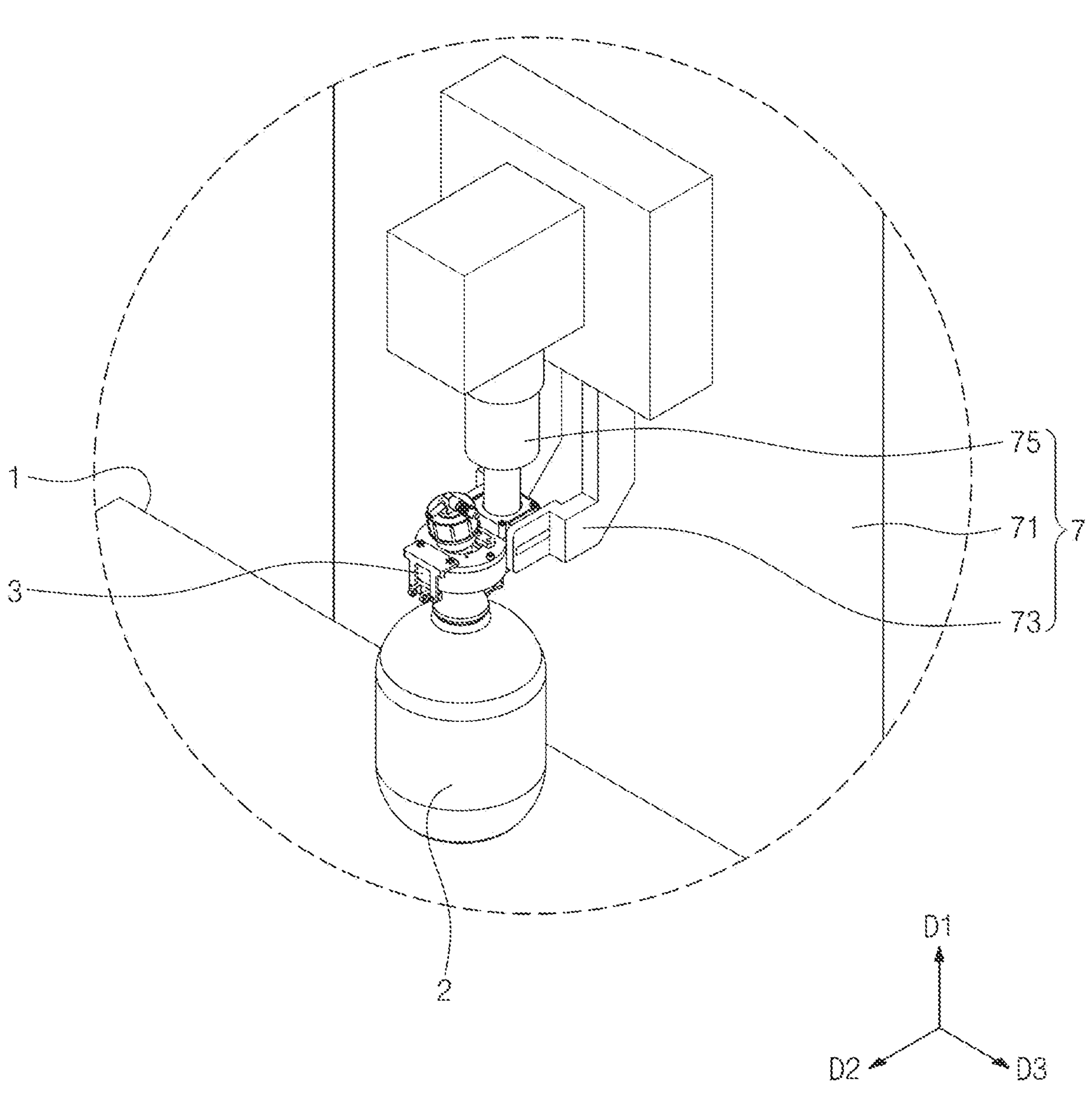
Figure 14:
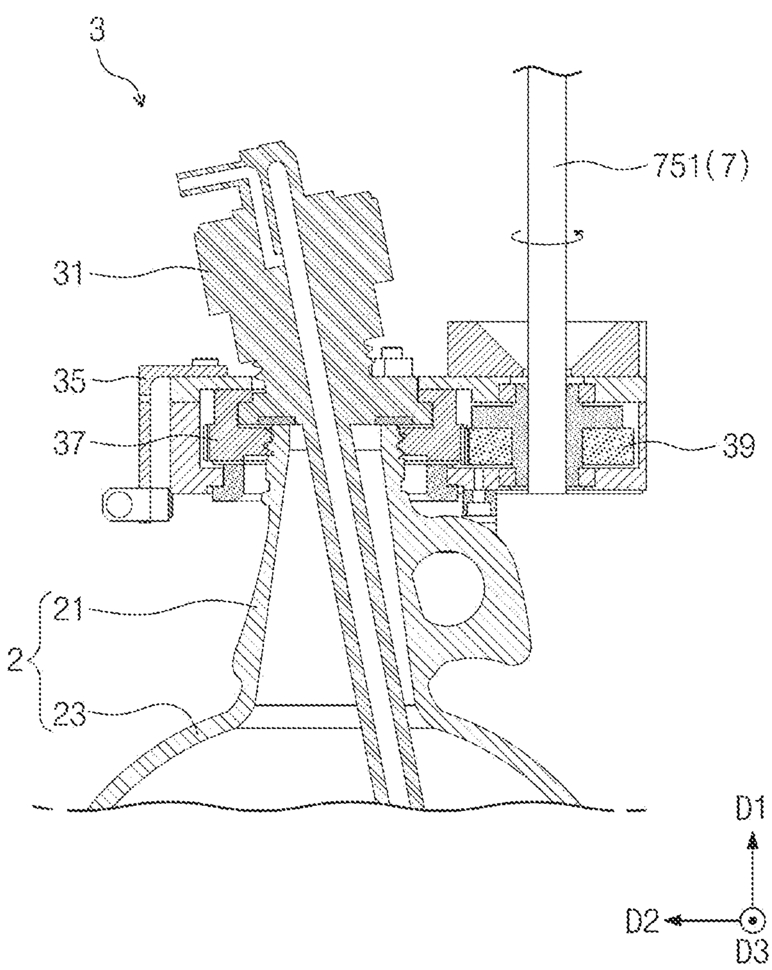

FIG. 10 is a flow chart illustrating a method of manufacturing a semiconductor device according to an embodiment of the inventive concept.

Referring to FIG. 10, a method S of manufacturing a semiconductor device may be provided. The method S may be a method of processing a substrate using the substrate processing system SY described with reference to FIGS. 1 to 9. The method S may include placing a substrate in a substrate processing apparatus (in S1), supplying a fluid into the substrate processing apparatus using a PR supplying device (in S2), and maintaining the PR supplying device (in S3).

The supplying of the fluid (in S2) may include supplying the fluid through a supply tube, which is coupled to a first tube fastener, (in S21) and supplying a gas into a PR container through a second tube fastener (in S22).

Hereinafter, the method S of FIG. 10 will be described in more detail with reference to FIGS. 11 to 15.

FIGS. 11 to 15 are diagrams illustrating the method according to the flow chart of FIG. 10.

Figure 11:
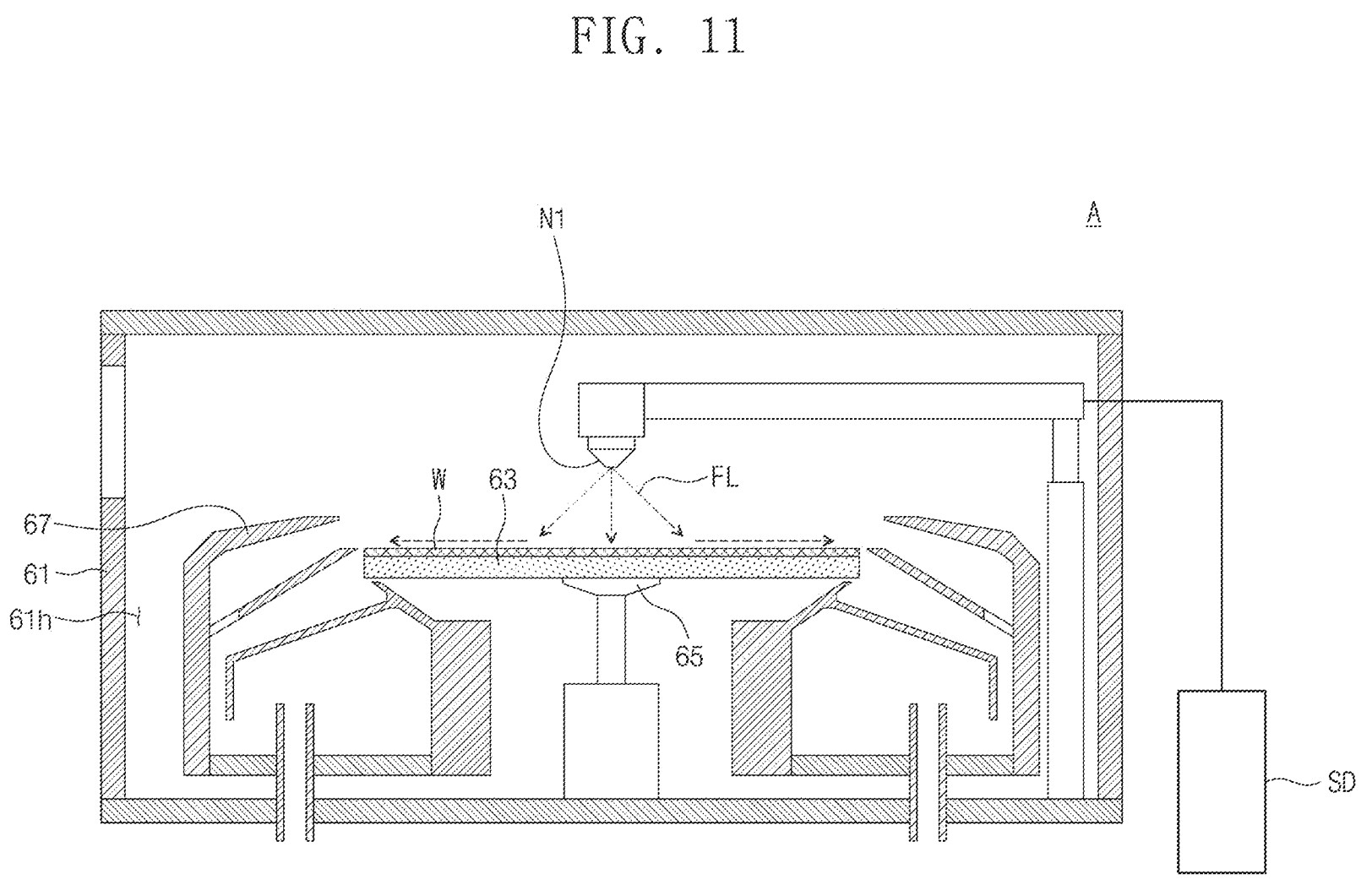

Referring to FIGS. 11 and 10, the placing of the substrate (in S1) may include loading a substrate W on the chuck 63.

The supplying of the fluid through the supply tube, which is coupled to the first tube fastener (in S21) may include supplying a fluid FL to the PR nozzle N1 through the PR supplying device SD. In an embodiment, the fluid FL may include a photoresist (PR) material. The fluid FL, which is supplied into the PR nozzle N1, may be sprayed onto the substrate W on the chuck 63. Accordingly, the substrate W may be covered with the PR material. For example, the substrate W may be coated with the PR material.

Referring to FIGS. 3 and 10, the supplying of the gas into the PR container through the second tube fastener (in S22) may include supplying the gas in the gas supplying part 8 to the PR container 2 through the second tube fastener 315. In an embodiment, the gas, which is supplied to the PR container 2, may be or include air, but the inventive concept is not limited to this example. An amount of the gas, which is supplied to the PR container 2, may be proportional to a fluid, which is exhausted from the PR container 2. An amount of the gas supplied to the PR container 2 may be substantially equal to an amount of the fluid exhausted from the PR container 2. Thus, the fluid FL (e.g., see FIG. 11) may be continuously supplied from the PR container 2 to the substrate processing apparatus A (e.g., see FIG. 11). In addition, it may be possible to prevent a gas bubble from being formed in the PR container 2. Referring to FIGS. 12, 13, 14, and 10, the maintaining of the PR supplying device (in S3) may include rotating the second gear 39. More specifically, the gripper 73 may be configured to grip the housing 35 to fix the housing in place. Thereafter, the rotating member 751 may be inserted in the rotary coupling structure 39*h* (e.g., see FIG. 6). In the case where the rotating member 751, which is inserted in the rotary coupling structure 39*h*, rotates, the second gear 39 may also rotate. As a result of the rotation of the second gear 39, the first gear 37 may also rotate. Since the housing 35 is fixed by the gripper 73, the housing 35 and the tube coupler 31 (e.g., see FIG. 6) may be fixed at a specific position without rotating, during the rotation of the first and second gears 37 and 39.

Figure 15:
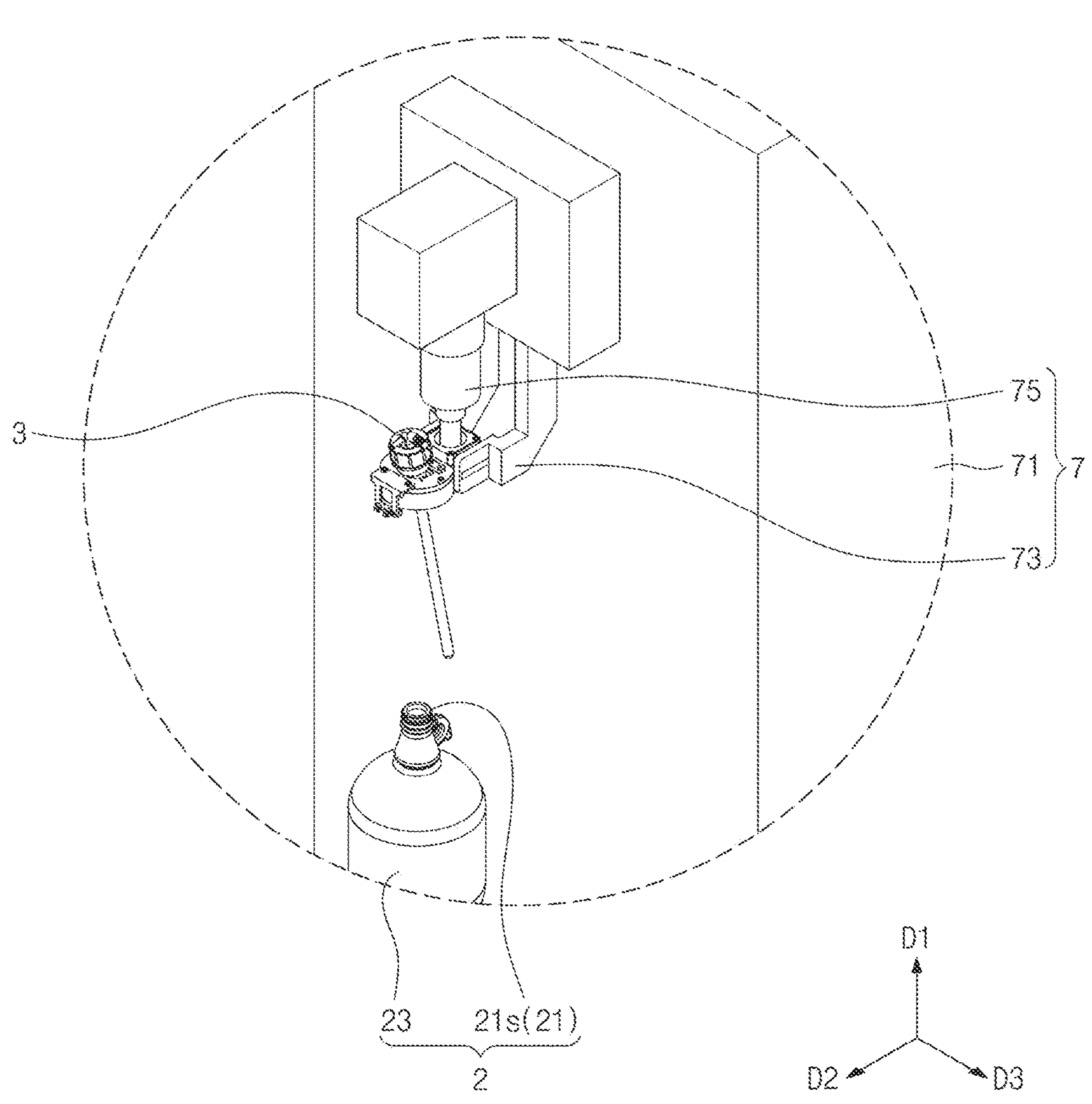

Referring to FIG. 15, the first gear 37 may be rotated to separate the container stopper 3 from the PR container 2. More specifically, the female thread structure 37*s* (e.g., see FIG. 6) of the first gear 37 and the male thread structure 21*s* of the PR container 2 may be separated from each other. Accordingly, the PR container 2 may be separated from the container stopper 3. Thereafter, the PR container 2 may be replaced with a new one.

A layer deposited on the substrate may be subject to exposure with a photolithographic mask. The exposed PR may be developed to create a PR pattern, and the layer may be etched using the PR pattern to form an integrated circuit in a wafer. The formed integrated circuit may then be singulated or cut from the wafer to form the semiconductor device.

In the container stopper according to an embodiment of the inventive concept, the substrate processing system including the same, and the method using the same, the replacing robot may be used to automatically separate the container stopper from the PR container. In other words, the operation of replacing the PR container may be automatically performed. This may make it possible to reduce the operation time for maintenance operations.

In the container stopper according to an embodiment of the inventive concept, the substrate processing system including the same, and the method using the same, by using two gears, it may be possible to execute an operation of the replacing robot at a position spaced apart from the PR container in a horizontal direction. Thus, the operation of the replacing robot may not be hindered even when the supply tube or the like is connected to the container stopper coupled to the PR container. Accordingly, the operation of replacing the PR container may be precisely executed.

In the container stopper according to an embodiment of the inventive concept, the substrate processing system including the same, and the method using the same, the QR code or the like may be used to recognize the type of the PR container. Accordingly, it may be possible to properly replace various types of PR containers.

In the container stopper according to an embodiment of the inventive concept, the substrate processing system including the same, and the method using the same, gas may be supplied into the PR container when a fluid in the PR container is supplied to the outside of the PR container. Accordingly, the operation of supplying the fluid from the PR container may be stably executed. In addition, it may be possible to prevent a gas bubble from being formed in the PR container. In this case, the quality of the fluid in the PR container may be maintained at a desired level.

In a container stopper according to an embodiment of the inventive concept, a substrate processing system including the same, and a method using the same, it may be possible to replace a PR container automatically.

In a container stopper according to an embodiment of the inventive concept, a substrate processing system including the same, and a method using the same, it may be possible to recognize various types of PR containers.

In a container stopper according to an embodiment of the inventive concept, a substrate processing system including the same, and a method using the same, it may be possible to reduce the operation time for maintenance operations.

While example embodiments of the inventive concept have been particularly shown and described, it will be understood by one of ordinary skill in the art that variations in form and detail may be made therein without departing from the spirit and scope of the disclosure.

What is claimed is:

1. A substrate processing system comprising a container stopper, wherein the container stopper comprises:

a first gear having a first axis extended in a first direction;

a second gear spaced apart from the first axis in a horizontal direction crossing the first direction;

a tube coupler coupled to the first gear; and an insertion tube extended from the tube coupler in a downward direction, wherein the tube coupler comprises:

a coupler body coupled to the first gear to be rotatable in relation to the first gear; and a first tube fastener, which is placed on and coupled to the coupler body and is connected to the insertion tube, wherein the first gear has a female thread structure formed on an inner side surface of the first gear, and wherein the second gear has a rotary coupling structure formed on a top or bottom surface of the second gear.

2. The substrate processing system of claim 1, wherein the first gear comprises first teeth formed on an outer side surface thereof, wherein the second gear comprises second teeth formed on an outer side surface thereof, and wherein the second teeth are configured to rotate while engaging with the first teeth.

3. The substrate processing system of claim 1, wherein the rotary coupling structure comprises a hole, which is recessed downward from a top surface of the second gear and has a hexagonal shape when viewed in a plan view.

4. The substrate processing system of claim 1, wherein the first gear further comprises a rotation space, wherein an inner radius of the first gear at the rotation space is larger than an inner radius of another portion of the first gear, and wherein a portion of the coupler body is in the rotation space.

5. The substrate processing system of claim 1, wherein the container stopper further comprises a housing enclosing the first gear and the second gear, and wherein each of the first gear and the second gear is rotatable in relation to the housing.

6. The substrate processing system of claim 1, wherein the tube coupler further comprises a second tube fastener, which is placed on and coupled to the coupler body and is connected to the insertion tube, wherein the first tube fastener extends in a second direction crossing the first direction, and wherein the second tube fastener extends in a third direction crossing both the first direction and the second direction.

7. The substrate processing system of claim 1, wherein an axis of the insertion tube is inclined to form an acute angle with the first direction.

8. The substrate processing system of claim 1, wherein the container stopper further comprises a marking member on the second gear, and wherein the marking member is configured to accommodate a rotating member to cause the second gear to rotate.

9. The substrate processing system of claim 1, further comprising a supply tube connected to the first tube fastener.

10. The substrate processing system of claim 9, further comprising a PR container coupled to the supply tube.

11. The substrate processing system of claim 10, further comprising a substrate processing apparatus, which is configured to receive a PR material from the PR container.

12. The substrate processing system of claim 11, wherein the substrate processing apparatus comprises:

a substrate processing chamber providing a process space;

a chuck in the process space; and a PR nozzle spaced apart upward from the chuck, wherein the PR nozzle is connected to the supply tube and is configured to receive the PR material from the supply tube.

13. The substrate processing system of claim 10, further comprising a supplying table supporting the PR container.

14. A substrate processing system, comprising a photoresist (PR) supplying device supplying a PR material, wherein the PR supplying device comprises:

a supply tube; and a container stopper connected to the supply tube, wherein the container stopper comprises:

a first gear having a first axis extended in a vertical direction;

a second gear spaced apart from the first axis in a horizontal direction; and a tube coupler, wherein the tube coupler comprises:

a coupler body coupled to the first gear to be rotatable in relation to the first gear; and a first tube fastener placed on and coupled to the coupler body and connected to the supply tube, and wherein the first gear has a female thread structure formed on an inner side surface of the first gear.

15. The substrate processing system of claim 14, further comprising a substrate processing apparatus, which is configured to receive the PR material from the PR supplying device and perform a process on a substrate, wherein the substrate processing apparatus comprises:

a substrate processing chamber providing a process space;

a chuck in the process space; and a PR nozzle spaced apart upward from the chuck, and wherein the PR nozzle is connected to the supply tube and is configured to receive the PR from the PR supplying device.

16. The substrate processing system of claim 15, further comprising a PR container coupled to the container stopper, wherein the PR container has a male thread structure configured to engage with the female thread structure of the first gear, wherein the container stopper further comprises an insertion tube extended downward from the tube coupler, and wherein at least a portion of the insertion tube is inserted in the PR container.

17. The substrate processing system of claim 16, further comprising a supplying table supporting the PR container, wherein the supplying table is configured to be insertable into the substrate processing chamber.

18. The substrate processing system of claim 14, further comprising a robot configured to rotate the second gear, wherein the second gear has a rotary coupling structure, which is recessed downward from a top surface of the second gear, and wherein the robot comprises a rotating member, which is configured to be selectively inserted into the rotary coupling structure and is used to rotate the second gear.

19. The substrate processing system of claim 18, wherein the container stopper further comprises a housing, which is provided to enclose the first gear and the second gear, and wherein the robot further comprises a gripper configured to grip the housing.

20. The substrate processing system of claim 19, wherein the housing comprises:

an extension hole exposing the rotary coupling structure; and a main hole vertically penetrating the housing, and in which the tube coupler is disposed.

* * * * *